(12) United States Patent
Mori et al.

(10) Patent No.: US 10,408,707 B2
(45) Date of Patent: Sep. 10, 2019

(54) ABNORMALITY DIAGNOSING METHOD AND ABNORMALITY DIAGNOSING SYSTEM

(71) Applicant: IHI Corporation, Koto-ku (JP)

(72) Inventors: Hatsuo Mori, Tokyo (JP); Noriyoshi Mizukoshi, Tokyo (JP); Takashi Ogai, Tokyo (JP); Yusuke Maru, Kanagawa (JP); Takayuki Yamamoto, Kanagawa (JP); Shinsuke Takeuchi, Kanagawa (JP); Satoshi Nonaka, Kanagawa (JP); Tsuyoshi Yagishita, Kanagawa (JP)

(73) Assignee: IHI Corporation, Koto-ku (JP)

( * ) Notice: Subject to any disclaimer, the term of this patent is extended or adjusted under 35 U.S.C. 154(b) by 87 days.

(21) Appl. No.: 15/664,525

(22) Filed: Jul. 31, 2017

(65) Prior Publication Data
US 2017/0328811 A1    Nov. 16, 2017

Related U.S. Application Data

(63) Continuation of application No. PCT/JP2016/054579, filed on Feb. 17, 2016.

(30) Foreign Application Priority Data

Feb. 18, 2015 (JP) .................................. 2015-029249

(51) Int. Cl.
*G01M 15/02* (2006.01)
*G06F 1/00* (2006.01)
(Continued)

(52) U.S. Cl.
CPC .............. *G01M 15/02* (2013.01); *B64G 1/52* (2013.01); *G05B 23/0243* (2013.01); *G06F 17/18* (2013.01); *G06F 17/5009* (2013.01)

(58) Field of Classification Search
CPC ..... B64G 1/52; G01M 15/02; G05B 23/0243; G06F 17/18; G06F 17/5009
See application file for complete search history.

(56) References Cited

U.S. PATENT DOCUMENTS

| 8,862,433 | B2* | 10/2014 | Yerramalla | .............. | G05B 9/02 |
| | | | | | 702/183 |
| 2002/0066054 | A1* | 5/2002 | Jaw | .......................... | G05B 9/03 |
| | | | | | 714/48 |

(Continued)

FOREIGN PATENT DOCUMENTS

| EP | 2 204 778 A2 | 7/2010 |
| JP | 6-103481 | 4/1994 |

(Continued)

OTHER PUBLICATIONS

Combined Decision to Grant and Search Report dated Jul. 10, 2018 in Russian Patent Application No. 2017132000, citing documents AO-AR therein, 17 pages, (with English translation).

(Continued)

*Primary Examiner* — Tyler J Lee
(74) *Attorney, Agent, or Firm* — Oblon, McClelland, Maier & Neustadt, L.L.P.

(57) ABSTRACT

An abnormality diagnosing method includes a model generation step of generating a simulation model of a monitoring target, an operation start step of starting an operation of the monitoring target, a measurement step of measuring an internal state quantity in the operating state of the monitoring target and extracting a measured value, a prediction step of inputting into the simulation model same control input value used in the operating state of the monitoring target and calculating a predicted value of the internal state quantity of the monitoring target, a Mahalanobis distance calculation step of calculating a Mahalanobis distance from a difference between the measured value and the predicted value, and an (Continued)

abnormality diagnosis step of diagnosing whether the operating state of the monitoring target is abnormal based on the Mahalanobis distance.

7 Claims, 5 Drawing Sheets

(51) Int. Cl.
*B64G 1/52* (2006.01)
*G06F 17/50* (2006.01)
*G06F 17/18* (2006.01)
*G05B 23/02* (2006.01)

(56) References Cited

U.S. PATENT DOCUMENTS

| | | | |
|---|---|---|---|
| 2003/0045992 A1* | 3/2003 | Humerickhouse | F02C 9/00 701/100 |
| 2005/0107984 A1* | 5/2005 | Samata | B25B 13/56 702/183 |
| 2005/0154562 A1* | 7/2005 | Matsuura | G06F 11/008 702/185 |
| 2005/0157327 A1* | 7/2005 | Shoji | G06K 15/408 358/1.14 |
| 2005/0222747 A1* | 10/2005 | Vhora | G05B 23/0254 701/100 |
| 2007/0124113 A1* | 5/2007 | Foslien | G05B 23/024 702/185 |
| 2008/0183444 A1 | 7/2008 | Grichnik et al. | |
| 2010/0161274 A1 | 6/2010 | Leao et al. | |
| 2010/0198555 A1 | 8/2010 | Takahama et al. | |
| 2011/0112775 A1 | 5/2011 | Bramban | |
| 2011/0288836 A1 | 11/2011 | Lacaille et al. | |
| 2011/0307220 A1* | 12/2011 | Lacaille | G05B 23/024 702/185 |
| 2012/0101706 A1* | 4/2012 | Masse | G05B 23/0221 701/100 |
| 2013/0179097 A1 | 7/2013 | Masse et al. | |
| 2013/0338898 A1 | 12/2013 | Aurousseau et al. | |
| 2015/0293523 A1* | 10/2015 | Yamamoto | G05B 19/4065 700/175 |

FOREIGN PATENT DOCUMENTS

| | | |
|---|---|---|
| JP | 2009-274588 | 11/2009 |
| JP | 2011-90382 | 5/2011 |
| JP | 2011-106467 | 6/2011 |
| JP | 2012-510585 | 5/2012 |
| JP | 2013-41490 | 2/2013 |
| JP | 2014-35282 | 2/2014 |
| RU | 2 385 456 C2 | 3/2010 |
| RU | 2 413 976 C1 | 3/2011 |
| RU | 2 441 271 C1 | 1/2012 |
| WO | WO 2009/107805 A1 | 9/2009 |
| WO | WO 2012/052696 A1 | 4/2012 |

OTHER PUBLICATIONS

International Search Report dated Apr. 26, 2016 in PCT/JP2016/054579 filed on Feb. 17, 2016 (with English Translation).
Written Opinion dated Apr. 26, 2016 in PCT/JP2016/054579 filed on Feb. 17, 2016.
Extended European Search Report dated Jul. 10, 2018 in European Patent Application No. 16752507.0, citing documents AA, AB and AO therein, 8 pages.

* cited by examiner $$\varepsilon_n = \left( \hat{X}_n - X_n, \sum_{i=n-k}^{n} \varepsilon_i \right) = \begin{bmatrix} \Delta Pc \\ \Delta Tjmf \\ \Delta Nf \\ \Delta No \\ \Delta Pdf \\ \Delta Pdo \\ \Sigma \Delta Pc \\ \Sigma \Delta Tjmf \\ \Sigma \Delta Nf \\ \Sigma \Delta No \\ \Sigma \Delta Pdf \\ \Sigma \Delta Pdo \end{bmatrix} \in R^{12}$$

ABNORMALITY DIAGNOSING METHOD AND ABNORMALITY DIAGNOSING SYSTEM

CROSS REFERENCE TO RELATED APPLICATIONS

This application is a continuation application of International Application No. PCT/JP2016/054579, filed on Feb. 17, 2016, which claims priority to Japanese Patent Application No. 2015-029249, filed on Feb. 18, 2015, the entire contents of which are incorporated by reference herein.

BACKGROUND

1. Technical Field

The present disclosure relates to an abnormality diagnosing method and an abnormality diagnosing system. Particularly, the present disclosure relates to an abnormality diagnosing method and an abnormality diagnosing system suitable for detecting an abnormality in a non-steady state that changes dynamically.

2. Description of the Related Art

In the field of various plants such as a gas turbine power plant, a nuclear power plant, a thermal power plant, and in the field of an internal-combustion engine such as a jet engine, an abnormality diagnosis of the plant or the engine is performed by monitoring an operating state (including a test operation) thereof to realize a stable operation and output.

For example, Japanese Patent Application Laid-Open No. 2011-090382 (Patent Literature 1) discloses a monitoring system in which a series of processes from monitoring of an indication of an abnormality of a monitoring target to a troubleshooting can be automated. This monitoring system includes a monitoring unit that acquires predetermined monitoring target data from the monitoring target, calculates a Mahalanobis distance thereof, and detects an abnormality in the monitoring target, a data processing unit that generates a predetermined input signal by extracting an abnormal signal indicating an indication of an abnormality and a related signal that is related monitoring target data, and a malfunction diagnosing unit that performs the troubleshooting with respect to the monitoring target based on the input signal.

Japanese Patent Application Laid-Open No. 2014-035282 (Patent Literature 2) discloses an abnormality diagnosing apparatus that diagnoses an abnormality of a plant by comparing values of a plurality of variables input newly from the plant with a predetermined unit space. This abnormality diagnosing apparatus includes an accumulated data storing unit that stores therein accumulated data including a value of each of the variables input in the past, a deciding unit that, for each of the variables, extracts a maximum value and a minimum value within a predetermined period of the accumulated data and decides a central value of these as a median value, a first calculating unit that calculates a difference between the value newly input for each of the variables and the median value, a second calculating unit that calculates a Mahalanobis distance by using the calculated difference for each of the variables and data of the predetermined unit space, and a determining unit that diagnoses an abnormality by determining whether the Mahalanobis distance is within a threshold range set beforehand.

SUMMARY

A monitoring target such as a plant or an internal-combustion engine generally has a steady state that is a stable operating state and a non-steady state that is a transient unstable operating state before the monitoring target reaches the steady state. In the non-steady state, the same monitoring target behaves differently depending on environmental conditions, operating conditions, and the like at a given time, and almost never shows the same dynamic change.

In the monitoring system disclosed in Patent Literature 1, by calculating the Mahalanobis distance of the monitoring target data, the input signal used in the troubleshooting is generated from the abnormal signal indicating the indication of the abnormality and the related signal. However, to determine whether there is the abnormality or the indication of the abnormality after calculating the Mahalanobis distance of the monitoring target data, it is necessary to prepare reference data beforehand. In case of the steady state, because the operating state and the outputting state are stable, it is possible to prepare the reference data. However, in case of the non-steady state that changes dynamically, the reference data cannot be generated from only the monitoring target data, so that the abnormality diagnosis cannot be performed.

Also in the abnormality diagnosing apparatus disclosed in Patent Literature 2, because the Mahalanobis distance is calculated by using the accumulated data of the past, like Patent Literature 1, although the abnormality diagnosis can be performed for the steady state by comparison thereof with the past data, the abnormality diagnosis cannot be performed for the non-steady state.

This disclosure has been made in view of the above discussion. One object of the present disclosure is to provide an abnormality diagnosing method and an abnormality diagnosing system that can perform the abnormality diagnosis not only in the steady state of the monitoring target but also in the non-steady state.

A first aspect of the present disclosure is an abnormality diagnosing method of diagnosing an abnormality of a monitoring target having an operating state that includes a non-steady state, the method including: generating a simulation model of the monitoring target; measuring an internal state quantity in the operating state of the monitoring target and extracting a measured value; inputting into the simulation model same control input value used in the operating state of the monitoring target and calculating a predicted value of the internal state quantity of the monitoring target; calculating a Mahalanobis distance from a difference between the measured value and the predicted value; and diagnosing whether the operating state of the monitoring target is abnormal based on the Mahalanobis distance.

The method may include calculating an error vector that includes the difference and an integral value of the difference as components thereof. Moreover, the calculating of the predicted value may be made based on a measured value that was measured immediate previously in a time series.

A second aspect of the present disclosure is an abnormality diagnosing system for diagnosing an abnormality of a monitoring target having an operating state that includes a non-steady state, the system including: a simulation model configured to simulate the monitoring target; a measuring unit configured to measure an internal state quantity in the operating state of the monitoring target; a diagnosing device configured to calculate a Mahalanobis distance from a difference between a predicted value calculated by the simulation model and a measured value extracted by the measuring unit and diagnoses whether the operating state of the monitoring target is abnormal based on the Mahalanobis distance; and a controlling unit configured to transmit same control input value to at least the monitoring target and the simulation model.

The diagnosing device may calculate the Mahalanobis distance based on an error vector that includes the difference and an integral value of the difference as components thereof. Moreover, the simulation model may calculate the predicted value based on a measured value that was measured immediate previously in a time series. The monitoring target is, for example, an engine for reusable spacecraft.

In the abnormality diagnosing method and the abnormality diagnosing system according to the present disclosure, a simulation model that simulates an internal state of a monitoring target is generated, and whether the monitoring target is abnormal is diagnosed by using a difference between a measured value obtained from the monitoring target and a predicted value calculated by the simulation model. Accordingly, the predicted value that suits with the environmental conditions and/or the operating conditions at the time the abnormality diagnosis is made can be calculated by the simulation model, and, because the difference has been used, the measured value obtained from the monitoring target can be replaced with a variation value of a normal value. Accordingly, even if the operating state of the monitoring target is the non-steady state, the dynamic change thereof can be followed and an action can be taken, and the abnormality diagnosis of the monitoring target can be performed not only in the steady state but also in the non-steady state. Moreover, by using the Mahalanobis distance in the abnormality diagnosis, the abnormality diagnosis can be made simple and fast.

BRIEF DESCRIPTION OF THE DRAWINGS

FIG. 3A shows an error vector and FIG. 3B shows an example of a calculation method of a predicted value.

FIG. 4A is a conceptual diagram of a Mahalanobis distance and FIG. 4B is a conceptual diagram of an abnormality diagnosis.

DESCRIPTION OF THE EMBODIMENTS

Figure 1:
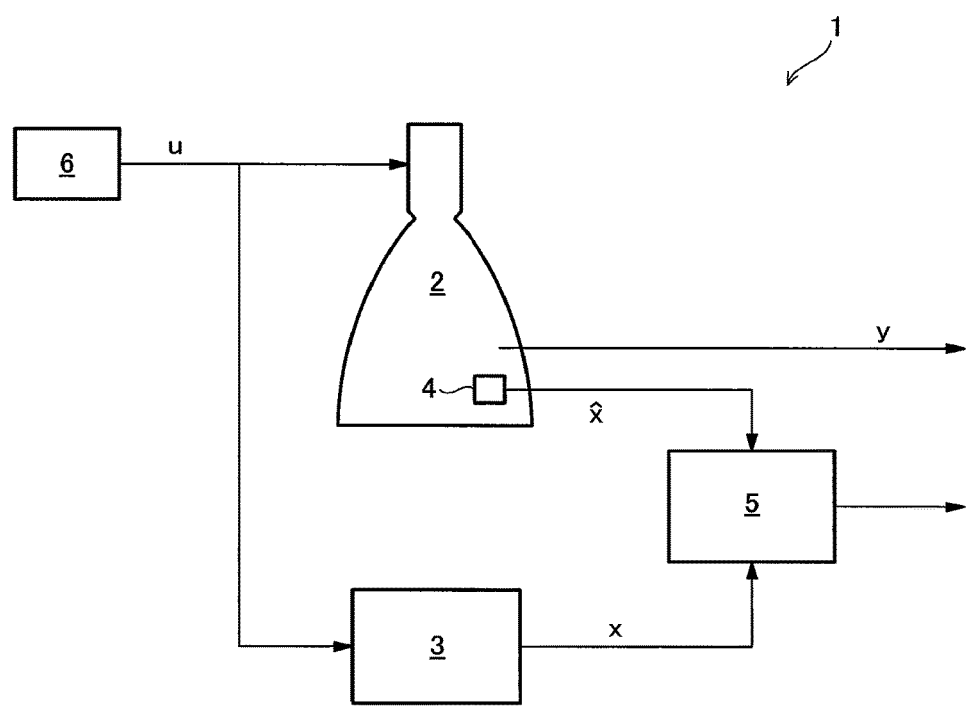
FIG. 1 is an overall structural schematic diagram of an abnormality diagnosing system according to the present disclosure.
Figure 2:
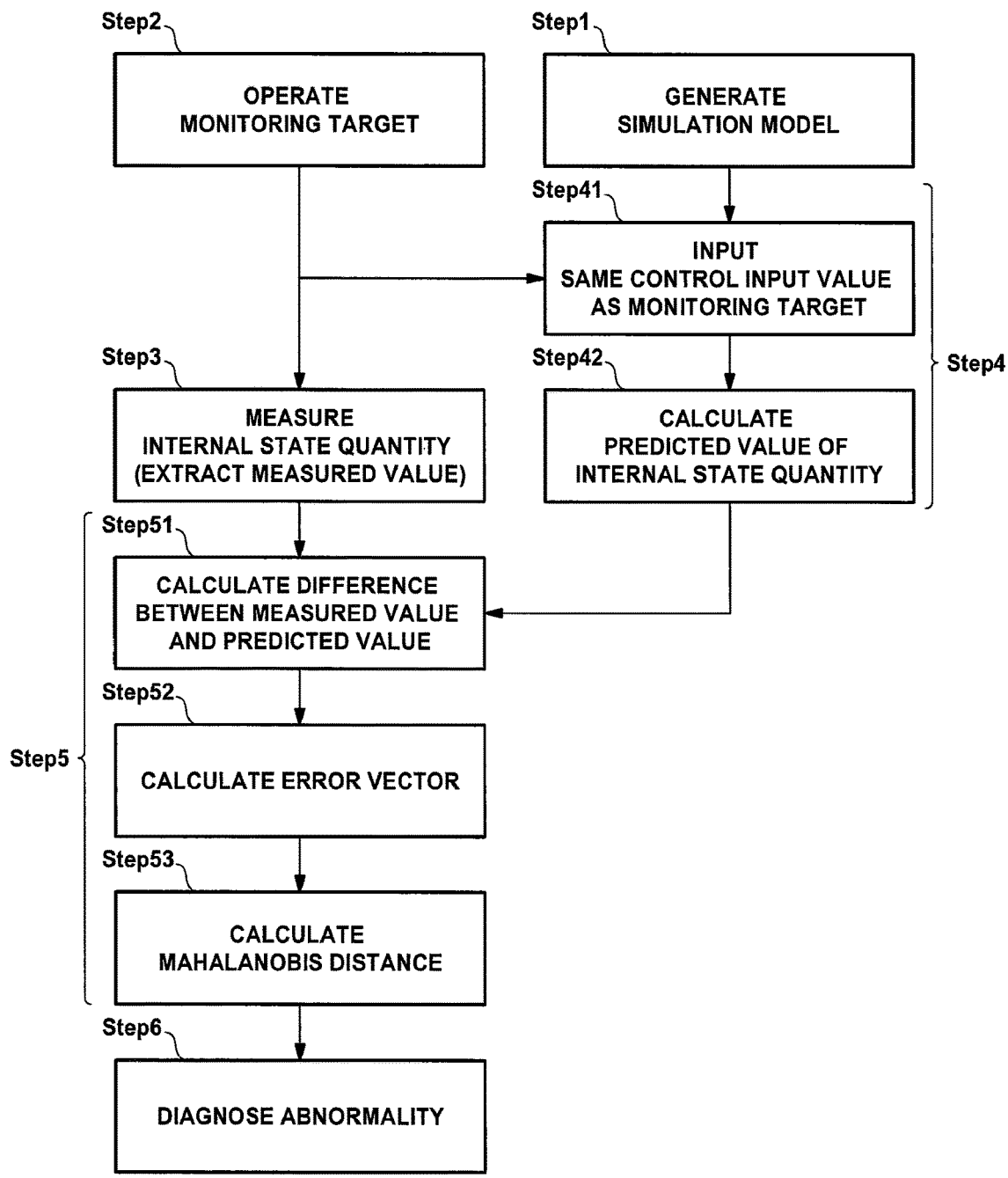
FIG. 2 is a flowchart of an abnormality diagnosing method according to the present disclosure.
Figures 3A, 3B:
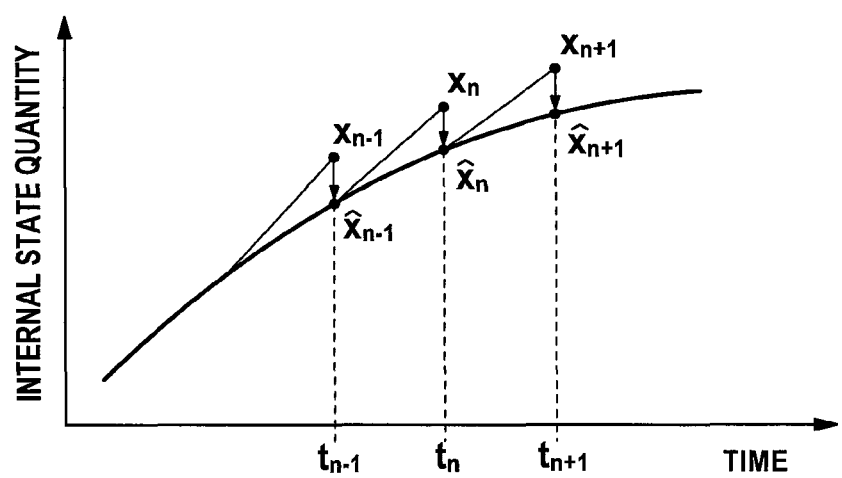
FIGS. 3A and 3B are drawings for explaining a Mahalanobis distance calculation step, where
Figure 4A:
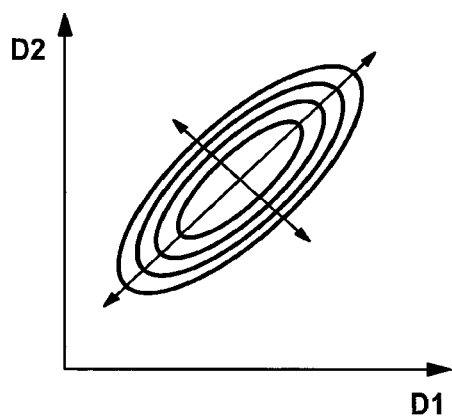
FIGS. 4A and 4B are drawings for explaining an abnormality diagnosis step, where
Figure 4B:
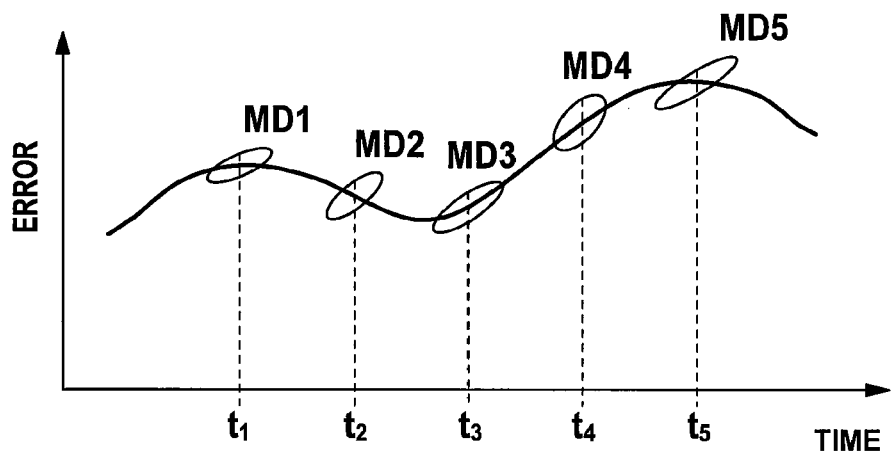

Exemplary embodiments according to the present disclosure are explained below by using the accompanying drawings. FIG. 1 is an overall structural schematic diagram of an abnormality diagnosing system according to the present disclosure. FIG. 2 is a flowchart of an abnormality diagnosing method according to the present disclosure. FIGS. 3A and 3B are drawings for explaining a Mahalanobis distance calculation step, where FIG. 3A shows an error vector and FIG. 3B shows an example of a calculation method of a predicted value. FIGS. 4A and 4B are drawings for explaining an abnormality diagnosis step, where FIG. 4A is a conceptual diagram of a Mahalanobis distance and FIG. 4B is a conceptual diagram of an abnormality diagnosis.

An abnormality diagnosing system 1 according to one embodiment of the present disclosure is, as shown in FIG. 1, an abnormality diagnosing system for diagnosing a monitoring target 2 having an operating state that includes a non-steady state. The abnormality diagnosing system 1 includes a simulation model 3 that simulates the monitoring target 2, a measuring unit 4 that measures a predetermined internal state quantity in the operating state of the monitoring target 2, a diagnosing device 5 that calculates a Mahalanobis distance MD from a difference ($\hat{x}-x$) between a predicted value x calculated by the simulation model 3 and a measured value $\hat{x}$ (^ (circumflex or hat) on x. Same holds true in the below explanation.) extracted from the measuring unit 4, and that diagnoses whether the operating state of the monitoring target 2 is abnormal based on the Mahalanobis distance MD, and a controlling unit 6 that transmits the same control input value u to both the monitoring target 2 and the simulation model 3.

The monitoring target 2 is, for example, an engine for reusable spacecraft. However, the monitoring target 2 is not limited to the engine for reusable spacecraft and can be any other internal-combustion engine such as a jet engine, various plants such as a gas turbine power plant, a nuclear power plant, a thermal power plant, a chemical plant, and the like. Particularly, it is desirable that the monitoring target 2 has a steady state that is a stable operating state and a non-steady state that is a transient unstable operating state before reaching the steady state.

The simulation model 3 is a model that allows an estimation of the internal state quantity of the monitoring target 2. The simulation model 3 is generated, for example, by applying a numerical simulation technique. In generating the simulation model, a recurrence relation expression (ARMA) can be used in consideration of a real-time process. When the monitoring target 2 is, for example, the engine for reusable spacecraft, as the internal state quantity, for example, a combustion pressure Pc, a regenerative cooling outlet temperature Tjmf, a fuel pump rotation frequency Nf, an oxidant pump rotation frequency No, a fuel pump outlet pressure Pdf, an oxidant pump outlet pressure Pdo, and the like, can be selected. Accordingly, the simulation model that allows calculation of these internal state quantities is generated. The simulation model 3 can be one simulation model that simulates the entire monitoring target 2 or can be constituted by a plurality of simulation models each of which calculates a different internal state quantity.

The measuring unit 4 is installed in the monitoring target 2. The measuring unit 4 is, for example, a sensor that measures one or more of the internal state quantities such as the combustion pressure Pc, the regenerative cooling outlet temperature Tjmf, the fuel pump rotation frequency Nf, the oxidant pump rotation frequency No, the fuel pump outlet pressure Pdf, and the oxidant pump outlet pressure Pdo. The measuring unit 4 is, for example, a pressure gauge, a thermometer, a rotary encoder, and the like. However, the measuring unit 4 is not limited to these devices, and can be selected appropriately based on the type of the monitoring target 2 and/or the internal state quantity to be measured.

The controlling unit 6 is a device that transmits to the monitoring target 2 the control input value u necessary to operate the monitoring target 2. The operating state of the monitoring target 2 can be an actual operation or can be a test operation. Moreover, the controlling unit 6 transmits also to the simulation model 3 the control input value u necessary to operate the monitoring target 2. The simulation model 3 calculates an internal state quantity based on this control input value u, and also calculates a predicted value x for each of the internal state quantities. It is allowable to measure an output value y of the monitoring target 2 that is operated by using the control input value u, and extract the output value y to the outside.

The diagnosing device 5 is a device that receives data of the measured value x^ measured by the measuring unit 4 and data of the predicted value x calculated by the simulation model 3, and performs an abnormality diagnosis of the monitoring target 2 by using the received data. The diagnosing device 5 performs a process based on, for example, the flowchart shown in FIG. 2. A diagnosis result and diagnosis data can be output from the diagnosing device 5 to the outside by various methods such as displaying on a monitor, printing on a paper, outputting in the form of data.

As shown in FIG. 2, the flowchart has the following steps: a model generation step (Step 1) of generating the simulation model 3 of the monitoring target 2, an operation start step (Step 2) of starting the operation of the monitoring target 2, a measurement step (Step 3) of measuring the internal state quantity in the operating state of the monitoring target 2 and extracting the measured value x^, a prediction step (Step 4) of inputting into the simulation model 3 the same control input value u used in the operating state of the monitoring target 2 and calculating the predicted value x of the internal state quantity of the monitoring target 2, a Mahalanobis distance calculation step (Step 5) of calculating the Mahalanobis distance MD from the difference (x^−x) between the measured value x^ and the predicted value x, and an abnormality diagnosis step (Step 6) of diagnosing whether the operating state of the monitoring target 2 is abnormal based on the Mahalanobis distance MD.

The diagnosing device 5 performs the Mahalanobis distance calculation step (Step 5) and the abnormality diagnosis step (Step 6). In the abnormality diagnosing method according to the present embodiment, whether the obtained data (measured value x^) is abnormal is diagnosed based on multivariable analysis that uses the Mahalanobis distance. A correlation among a plurality of variables can be processed at one time by using the Mahalanobis distance. That is, because it is not necessary to separately perform the diagnosis per variable to decide whether the variable is abnormal, the abnormality diagnosis can be made simple and fast.

The Mahalanobis distance calculation step (Step 5), as shown in FIG. 2, can include a difference calculation step (Step 51) of calculating the difference (x^−x) between the measured value x^ and the predicted value x, an error vector calculation step (Step 52) of calculating an error vector ε having the difference (x^−x) and an integral value Σε of an error as components thereof, and a Mahalanobis distance computation step (Step 53) of calculating the Mahalanobis distance MD based on the error vector ε.

The error vector ε can be expressed in the manner shown in FIG. 3A. When an error vector that changes with time is calculated continuously, the integral value Σε, which constitutes a component of the error vector ε, can be calculated as a so-called integral value. To calculate the error vector ε per a certain period of time (span), the integral value Σε can be calculated as a grand total of the difference (x^−x). In this manner, a cumulative error evaluation sensitivity in the same direction can be prevented from becoming weak by use of the integral value Σε of the error (difference).

When the combustion pressure Pc, the regenerative cooling outlet temperature Tjmf, the fuel pump rotation frequency Nf, the oxidant pump rotation frequency No, the fuel pump outlet pressure Pdf, and the oxidant pump outlet pressure Pdo are selected as the internal state quantity, for example, the error vector ε can be written as a matrix of (ΔPc, ΔTjmf, ΔNf, ΔNo, ΔPdf, ΔPdo, ΣΔPc, ΣΔTjmf, ΣΔNf, ΣΔNo, ΣΔPdf, ΣΔPdo) as shown in FIG. 3A. In this example, because the error vector ε includes 12 variables, the error vector ε is contained in a vector space $R^{12}$ formed by these variables.

The prediction step (Step 4) includes an inputting step (Step 41) of inputting into the simulation model 3 the same control input value u as the operation of the monitoring target 2, and a predicted value calculation step (Step 42) of calculating the predicted value x of the internal state quantity based on the control input value u. At the predicted value calculation step Step 42 (prediction step (Step 4)), as shown in FIG. 3B, it is allowable to calculate a predicted value xn based on a measured value $x_{n-1}$^ that was measured immediately previously in the time series (i.e. a last value previously measured in the time series). That is, the predicted value xn is calculated based on the measured value $x_{n-1}$^, and a predicted value $x_{n+1}$ is calculated based on a measured value $x_n$^. With this method, the accumulation of the error can be inhibited, the accuracy of predicted value $x_n$ can be improved, and therefore, the accuracy of the abnormality diagnosis can be improved.

At the Mahalanobis distance computation step (Step 53), to calculate the Mahalanobis distance MD from the error vector ε, at first, the error vector ε is standardized by using Expression 1 to convert the error vector into a state so that the error vector ε does not depend on a physical quantity unit. To standardize the error vector ε, an entire average value vector during the operation period $$\bar{\varepsilon}$$ [Equation 1]

and a deviation $$\sigma\varepsilon$$ [Equation 2]

are used.

[Equation 3]

$$\varepsilon_n'' = \left( \frac{\varepsilon_{n1} - \overline{\varepsilon_{n1}}}{\sigma\varepsilon_{n1}}, \frac{\varepsilon_{n2} - \overline{\varepsilon_{n2}}}{\sigma\varepsilon_{n2}}, \dots, \frac{\varepsilon_{n12} - \overline{\varepsilon_{n12}}}{\sigma\varepsilon_{n12}} \right) \quad \text{(Expression 1)}$$

where

[Equation 4]

$$\overline{\varepsilon_{n1}} = \frac{1}{N} \sum_{n=1}^{N} \varepsilon_n, \quad \sigma\varepsilon_n = \sqrt{\frac{\Sigma(\varepsilon_n - \overline{\varepsilon_n})^2}{N}}$$

The error vector εn" standardized based on Expression 1 is expressed as εn and used in the subsequent calculation.

Then, the Mahalanobis distance MD is calculated by using Expression 2. Here, $\varepsilon^T$ indicates a transposed matrix of the error vector ε, and dim(ε) indicates a dimension of the error vector ε. Moreover, a covariance matrix can be derived, for example, from the accumulated data of the past that is diagnosed as being normal.

[Equation 5]

$$MD_n = \sqrt{\varepsilon_n \mathfrak{R}^{-1} \varepsilon_n^T / \dim(\varepsilon)}$$ (Expression 2)

where $$\mathfrak{R}$$ [Equation 6]

is the covariance matrix.

By calculating the Mahalanobis distance MD and connecting equidistant points, for example, a correlation among the internal state quantities shown in FIG. 4A can be calculated. The error becomes large as one goes away from a center of a substantially elliptical region shown in this drawing. Therefore, it can be diagnosed that there is an abnormality when the value is outside of this region. The correlation shown in FIG. 4A represents a correlation between only two variables, i.e., internal state quantities D1 and D2, to promote an intuitive understanding. From this correlation, it can be understood that a permissible value of the error is large along the major axis of this substantially elliptical region, and a permissible value of the error is small along the minor axis of this substantially elliptical region. Although not shown in this drawing, a 12-dimensional correlation is obtained when the 12 variables are used as mentioned above.

At the abnormality diagnosis step Step 6, for example, as shown in FIG. 4B, the Mahalanobis distance MD is calculated, with respect to the error (difference) that changes over time, each time the diagnosis is performed. Moreover, a determination is made as to whether the error (difference) is within the Mahalanobis distance MD each time the Mahalanobis distance MD is calculated. For example, a Mahalanobis distance MD1 at time t1, a Mahalanobis distance MD2 at time t2, a Mahalanobis distance MD3 at time t3, a Mahalanobis distance MD4 at time t4, and a Mahalanobis distance MD5 at time t5 change from time to time based on the environmental conditions, the operating conditions, and the like at a given time. The graph of FIG. 4B is shown to promote an intuitive understanding of the abnormality diagnosing method according to the present embodiment.

In the abnormality diagnosing method and the abnormality diagnosing system 1 according to the present embodiment, the simulation model 3 that simulates the internal state of the monitoring target 2 is generated, and whether the monitoring target 2 is abnormal is diagnosed by using the difference ($\hat{x}-x$) between the measured value $\hat{x}$ obtained by the monitoring target 2 and the predicted value x calculated by the simulation model 3. Accordingly, the predicted value x that suits with the environmental conditions and/or the operating conditions at the time the abnormality diagnosis is made can be calculated by the simulation model 3. Moreover, because the difference has been used, the measured value $\hat{x}$ obtained by the monitoring target 2 can be replaced with a variation value of a normal value. Accordingly, even if the operating state of the monitoring target 2 is the non-steady state, the dynamic change thereof can be followed and an action can be taken, and the abnormality diagnosis of the monitoring target 2 can be performed not only in the steady state but also in the non-steady state.

Figure 5A:
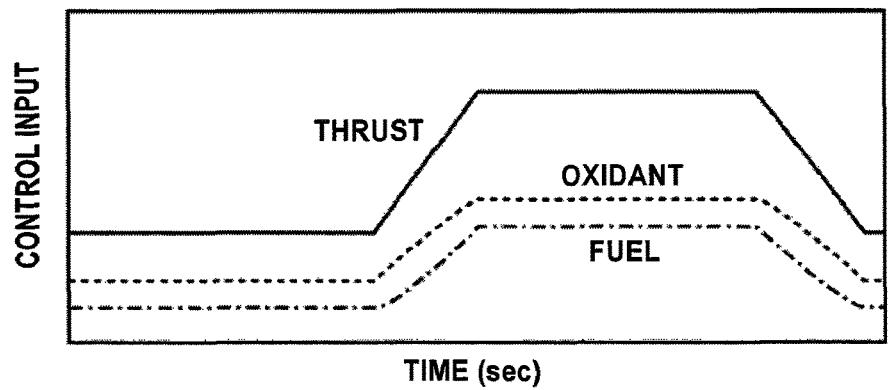
FIGS. 5A to 5C are explanatory drawings to verify the efficacy when the present disclosure is applied to an engine for reusable spacecraft, where a result of the abnormality diagnosis based on a control input value is shown in FIG. 5A, the same based on simulated data of a measured value is shown in FIG. 5B, and the same based on the Mahalanobis distance is shown in FIG. 5C.
Figure 5B:
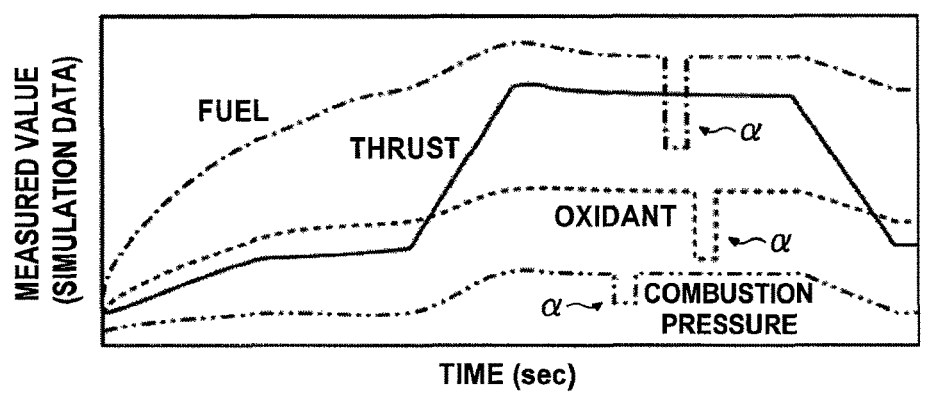
Figure 5C:
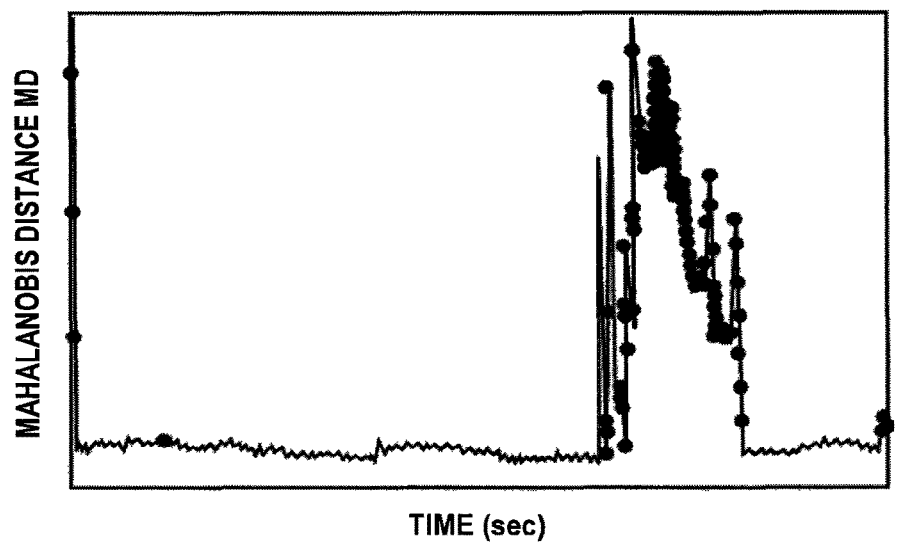

FIG. 5A to FIG. 5C are explanatory drawings to verify the efficacy when the present disclosure is applied to the engine for reusable spacecraft, and a result of the abnormality diagnosis based on a control input value is shown in FIG. 5A, the same based on simulated data of the measured value is shown in FIG. 5B, and the same based on the Mahalanobis distance is shown in FIG. 5C. In FIG. 5A and FIG. 5B, a thrust value is shown by a continuous line, a fuel value is shown by a dotted line, an oxidant value is shown by an alternate long and short dash line, and a combustion pressure value is shown by a two-dot chain line. In FIG. 5A, a portion of the thrust curve that protrudes up (substantially trapezoidal portion) simulates the non-steady state.

The amount of the fuel and the oxidant are controlled to obtain the thrust shown in FIG. 5A. Here, to verify the efficacy of the abnormality diagnosis performed by using the Mahalanobis distance MD, as shown in FIG. 5B, by setting an offset value (portion a in the drawing) with respect to the normal measured value, simulated data of the measured value that intentionally includes an abnormal value has been generated. When the Mahalanobis distance calculation step Step 5 is performed by using the simulated data of the measured value and the predicted value calculated by the simulation model 3, a result shown in FIG. 5C is obtained.

In FIG. 5C, a continuous line shows a change of the Mahalanobis distance MD over time, and black dots show points in time at which diagnosed as being abnormal. It can be understood from this verification result that the Mahalanobis distances MD of the parts corresponding to the offset portions in which the abnormal values were intentionally set have been diagnosed as being abnormal. Accordingly, it can be confirmed that the abnormality diagnosing method and the abnormality diagnosing system 1 according to the present embodiment are able to perform the abnormality diagnosis when the operating state includes the non-steady state.

The present disclosure is not limited to the above embodiments, and it can be implemented by making various changes in a range that do not deviate from the gist of the present disclosure.

What is claimed is:

1. A method of diagnosing an abnormality comprising:
generating a simulation model of a monitoring target configured to be operated based on a control value input to the monitoring target;
measuring an internal state quantity of the monitoring target in an operating state as a measured value;
calculating a predicted value of the internal state quantity of the monitoring target by inputting a value, which is same as the control value input to the monitoring target in the operating state, into the simulation model;
calculating a Mahalanobis distance based on an error vector that includes, as components thereof, a difference between the measured value and the predicted value and an integral value of the difference in a predetermined period in the operating state of the monitoring target; and
diagnosing whether the operating state of the monitoring target is abnormal based on the Mahalanobis distance.

2. The method of diagnosing an abnormality according to claim 1, wherein the predicted value is calculated based on the last value of the measured values successively measured.

3. The method of diagnosing an abnormality according to claim 1, wherein the monitoring target is an engine for reusable spacecraft, and the internal state quantity includes at least one of a combustion pressure, a regenerative cooling outlet temperature, a fuel pump rotation frequency, an oxidant pump rotation frequency, a fuel pump outlet pressure, and an oxidant pump outlet pressure.

4. A system for diagnosing an abnormality comprising:
a simulation model that simulates a monitoring target configured to be operated based on a control value input to the monitoring target;
a measuring unit configured to measure an internal state quantity in an operating state of the monitoring target as a measured value;
a controlling unit configured to transmit the control value to the monitoring target and transmit a value, which is same as the control value, to the simulation model; and
a diagnosing device that calculates a Mahalanobis distance based on an error vector that includes, as components thereof, a difference between a predicted value calculated by the simulation model and the measured value measured by the measuring unit and an integral value of the difference in a predetermined period in the operating state of the monitoring target, and diagnoses whether the operating state of the monitoring target is abnormal based on the Mahalanobis distance.

5. The system for diagnosing an abnormality according to claim 4, wherein the simulation model calculates the predicted value based on the last value of the measured values successively measured.

6. The system for diagnosing an abnormality according to claim 4, wherein the monitoring target is an engine for reusable spacecraft.

7. The system for diagnosing an abnormality according to claim 6, wherein the internal state quantity includes at least one of a combustion pressure, a regenerative cooling outlet temperature, a fuel pump rotation frequency, an oxidant pump rotation frequency, a fuel pump outlet pressure, and an oxidant pump outlet pressure.

* * * * *